United States Patent
Liu et al.

(10) Patent No.: US 11,891,690 B2
(45) Date of Patent: Feb. 6, 2024

(54) MOLYBDENUM THIN FILMS BY OXIDATION-REDUCTION

(71) Applicant: Applied Materials, Inc., Santa Clara, CA (US)

(72) Inventors: Feng Q. Liu, San Jose, CA (US); Alexander Jansen, San Jose, CA (US); Mark Saly, Santa Clara, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 414 days.

(21) Appl. No.: 16/990,303

(22) Filed: Aug. 11, 2020

(65) Prior Publication Data
US 2021/0047726 A1    Feb. 18, 2021

Related U.S. Application Data

(60) Provisional application No. 62/885,814, filed on Aug. 12, 2019.

(51) Int. Cl.
| | |
|---|---|
| *C23C 16/18* | (2006.01) |
| *C23C 16/455* | (2006.01) |
| *H01L 21/285* | (2006.01) |
| *H01L 21/02* | (2006.01) |

(52) U.S. Cl.
CPC ........ *C23C 16/18* (2013.01); *C23C 16/45527* (2013.01); *C23C 16/45553* (2013.01); *H01L 21/0234* (2013.01); *H01L 21/02175* (2013.01); *H01L 21/02205* (2013.01); *H01L 21/28568* (2013.01)

(58) Field of Classification Search
CPC ......... C23C 16/16; C23C 16/18; C23C 16/40; C23C 16/45525; C23C 16/45527; C23C 16/45553
See application file for complete search history.

(56) References Cited

U.S. PATENT DOCUMENTS

| | | | |
|---|---|---|---|
| 3,253,946 A * | 5/1966 | Kozikowski | C23C 16/16 427/249.1 |
| 4,431,708 A | 2/1984 | Carver et al. | |
| 9,460,959 B1 | 10/2016 | Xie et al. | |
| 2006/0223300 A1* | 10/2006 | Simka | H01L 21/76862 257/E21.171 |
| 2018/0019165 A1 | 1/2018 | Baum et al. | |
| 2018/0294187 A1 | 10/2018 | Thombare et al. | |
| 2019/0027573 A1* | 1/2019 | Zhu | H01L 29/4966 |
| 2019/0067094 A1* | 2/2019 | Zope | H01L 21/32051 |

FOREIGN PATENT DOCUMENTS

| | | | |
|---|---|---|---|
| WO | WO 2010114386 | * 10/2010 | |
| WO | 2017143246 A1 | 8/2017 | |

OTHER PUBLICATIONS

PCT International Search Report and Written Opinion in PCT/US2020/045730 dated Nov. 11, 2020, 13 pages.

* cited by examiner

*Primary Examiner* — Elizabeth A Burkhart
(74) *Attorney, Agent, or Firm* — Servilla Whitney LLC

(57) ABSTRACT

A method of forming a molybdenum film by oxidation and reduction is disclosed. A molybdenum oxide film is formed by CVD or ALD using a halide free organometallic molybdenum precursor. The molybdenum oxide film contains low amounts of carbon impurities. The molybdenum oxide film is reduced to form a highly pure molybdenum film. The molybdenum film has low resistance and properties similar to bulk molybdenum.

19 Claims, 3 Drawing Sheets

MOLYBDENUM THIN FILMS BY OXIDATION-REDUCTION

CROSS-REFERENCE TO RELATED APPLICATIONS

This application claims priority to U.S. Provisional Application No. 62/885,814, filed Aug. 12, 2019, the entire disclosure of which is hereby incorporated by reference herein.

TECHNICAL FIELD

Embodiments of the present disclosure generally relate to methods of forming high purity metallic films. Some embodiments provide methods for forming high purity molybdenum films.

BACKGROUND

Molybdenum thin films have attracted much more attention recently due to their lower resistivity and thermal stability with other metals. As a result, molybdenum has become a preferred material for metal capping, as a conductor to replace cobalt as a capping layer, and/or to replace tungsten as a conductor.

Current molybdenum film deposition processes rely on $MoF_6$ with mono-silane. The process produces films containing F and Si. Further, exposure to the $MoF_6$ precursor can lead to damage of underlying materials on the substrate.

Alternative molybdenum formation processes have relied on organometallic precursors. The films deposited with organometallic precursors often contain a significant amount of carbon. In both cases, the contaminants in the films alter the properties of the films and render them unsuitable for several applications.

Accordingly, there is a need for methods of forming high purity molybdenum films and methods which deposit high purity films without exposing the substrate to halide-containing precursors.

SUMMARY

One or more embodiments of the disclosure are directed to a method of forming a molybdenum film. The method comprises exposing a substrate surface to an organometallic molybdenum precursor and an oxidant to form a molybdenum oxide film. The molybdenum oxide film is reduced to form a molybdenum film.

Additional embodiments of the disclosure are directed to a method of forming a molybdenum film. The method comprises exposing a substrate surface maintained at a temperature in a range of about 100° C. to about 500° C. to a plurality of ALD cycles to form a molybdenum oxide film with a thickness in a range of 0.2 nm to about 100 nm. Each cycle comprises exposure to an organometallic molybdenum precursor and an oxidant. The organometallic molybdenum precursor comprises substantially no halogen atoms. The molybdenum oxide film is exposed to an alcohol while maintained at a temperature in a range of about 250° C. to about 500° C. to form a molybdenum film.

Further embodiments are directed to a method of forming a molybdenum film. The method comprises exposing a substrate surface to a plurality of ALD cycles to form a molybdenum oxide film with a thickness in a range of 0.2 nm to about 100 nm. Each cycle comprises exposure to an organometallic molybdenum precursor and an oxidant. The molybdenum oxide film has a carbon content of less than or equal to about 5 atomic percent. The molybdenum oxide film is exposed to a reductant to form a molybdenum film. The molybdenum film has an impurity content of less than or equal to about 5 atomic percent.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
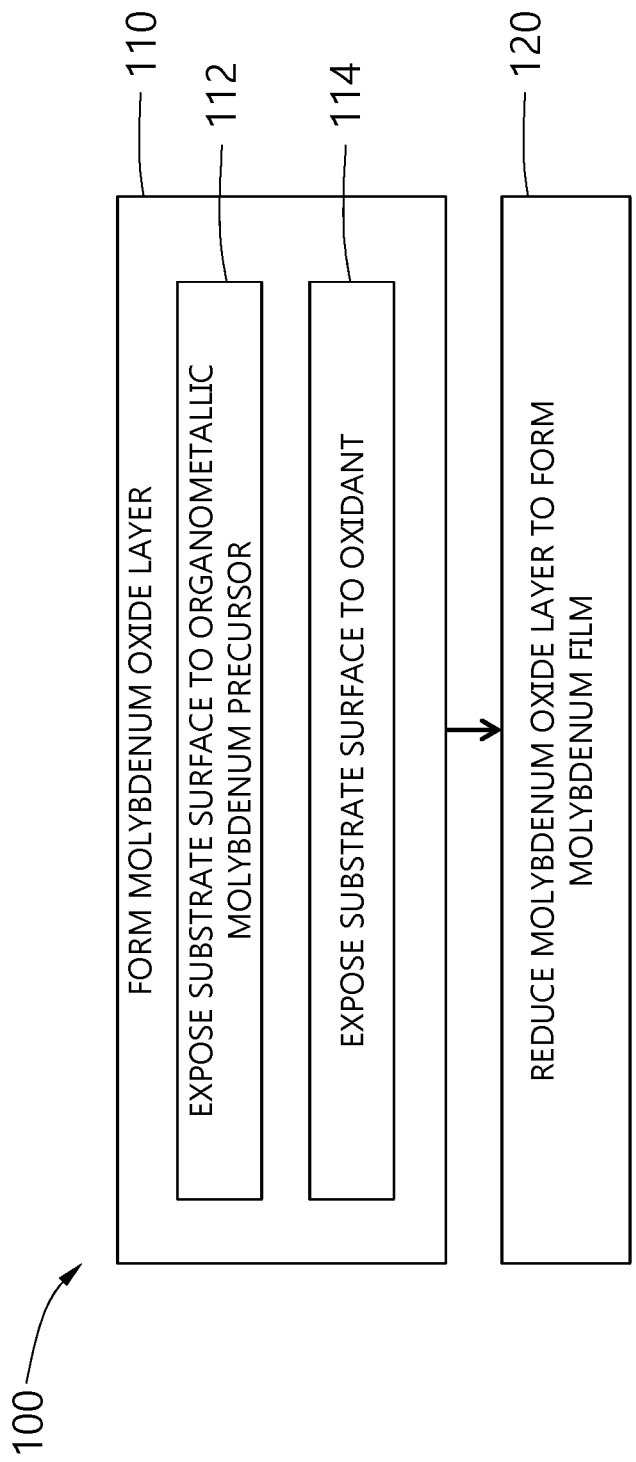
FIG. 1 illustrates an exemplary process sequence for the formation of a molybdenum film according to one or more embodiment of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides (e.g., titanium nitride, tantalum nitride), metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

Embodiments of the present disclosure relate to methods for forming molybdenum films by oxidation and reduction. Some embodiments of the disclosure advantageously provide methods for depositing metal films with high purity. Some embodiments of the disclosure advantageously provide high purity molybdenum films. Accordingly, these highly pure films exhibit similar properties to their associated bulk materials. For example, some embodiments of this disclosure provide molybdenum films which have lower resistance than molybdenum films deposited by conventional processes. Some embodiments of the disclosure advantageously provide molybdenum films without the use of halogen-containing precursors. Some embodiments of the disclosure advantageously provide methods for reducing metal oxides with alcohols.

As used in this specification and the appended claims, the terms "precursor", "reactant", "reactive gas" and the like are used interchangeably to refer to any gaseous species that can react with the substrate surface.

FIG. 1 illustrates an exemplary process sequence 100 for the formation of a ruthenium film according to one or more embodiment of the disclosure. At 110, a molybdenum oxide film is formed. According to some embodiments of this disclosure, the molybdenum oxide film is formed by exposing a substrate surface to an organometallic molybdenum precursor at 112 and an oxidant at 114.

According to FIG. 1, the formation of the molybdenum oxide film at 110 should not be understood to be limited to simultaneous or sequential exposures to the substrate surface. Specific embodiments related to simultaneous exposures are described below with respect to FIG. 2. Specific embodiments related to sequential exposures are described below with respect to FIG. 3.

At 112, the substrate surface is exposed to an organometallic molybdenum precursor. The organometallic molybdenum precursor may be any suitable molybdenum precursor for forming a molybdenum oxide film.

In some embodiments, the organometallic molybdenum precursor comprises substantially no halogen atoms. Without being bound by theory, it is believed that the use of organometallic molybdenum precursors without halogen atoms prevents damage to the underlying substrate materials during deposition of the molybdenum oxide film.

In some embodiments, the organometallic molybdenum precursor comprises at least one molybdenum-carbon bond. For example, a carbonyl ligand typically associates with the metal center of an organometallic metal precursor resulting in a metal-carbon bond. Without being bound by theory, it is believed that organometallic molybdenum precursors containing molybdenum-carbon bonds demonstrate good reactivity, but typically provide molybdenum films with significant carbon content if used for the direct deposition of molybdenum films.

In some embodiments, the organometallic molybdenum precursor comprises or consists essentially of one or more of tBuDADMo(CO)$_4$, Cycloheptatriene molybdenum tricarbonyl, bis(t-butylimido) bis(dimethylamino) Mo, bis(ethylbenzene)molybdenum, Mo14, CpMo(CO)$_2$(NO), MeCpMo(CO)$_2$(NO), (Bicyclo[2.2.1]hepta-2,5-diene)tetracarbonylmolybdenum(0), or molybdenum(CO)$_6$. As used in this regard, an organometallic molybdenum precursor which "consists essentially of" a stated compound comprises greater than or equal to about 95%, 98%, 99% or 99.5% of the stated compound as measured as a molar percent of active precursor within the organometallic molybdenum precursor.

At 114, the substrate surface is exposed to an oxidant. The oxidant may be any suitable oxidant for reacting with the organometallic molybdenum precursor to form a molybdenum oxide film.

In some embodiments, the oxidant comprises one or more of oxygen ($O_2$), ozone or water. In some embodiments, the oxidant comprises a plasma of oxygen, ozone or water. In some embodiments, the oxidant comprises a plasma generated from oxygen ($O_2$).

The substrate surface may be maintained at a predetermined temperature during various process steps. In some embodiments, during the formation of the molybdenum oxide film at 110, the substrate is maintained at a temperature in a range of about 100° C. to about 500° C. or about 100° C. to about 400° C. In some embodiments, during reduction of the molybdenum oxide film at 120, the substrate is maintained at a temperature in a range of about 250° C. to about 500° C., about 250° C. to about 450° C. or about 300° C. to about 400° C.

At 110, the molybdenum oxide film may be formed to a predetermined thickness. In some embodiments, the molybdenum oxide film has a thickness in a range of about 0.2 nm to about 100 nm, about 0.2 nm to about 10 nm, about 0.2 to about 5 nm, or about 0.5 nm to about 10 nm.

In some embodiments, the molybdenum oxide film has a low carbon content. In some embodiments, the carbon content of the molybdenum oxide film is less than or equal to about 10%, less than or equal to about 5% less than or equal to about 2% or less than or equal to about 1% on an atomic percent basis.

Without being bound by theory, while organometallic molybdenum precursors comprising molybdenum-carbon bonds produce molybdenum films with elevated carbon impurities, the inventors have found that these precursors produce molybdenum oxide films with relatively low carbon impurities.

Referring again to FIG. 1, at 120, the molybdenum oxide film is reduced to form a molybdenum film. In some embodiments, reducing the molybdenum oxide film comprises exposing the molybdenum oxide film to a reductant comprising an alcohol, hydrogen gas or hydrogen plasma.

In some embodiments, the alcohol comprises 1-4 carbon atoms, 5-8 carbon atoms or 1-8 carbon atoms. In some embodiments, the alcohol comprises or consists essentially of one or more of methanol, ethanol, propanol, isopropanol, butanol or t-butanol.

The alcohol may be introduced to the processing chamber by any suitable process. In some embodiments, the alcohol may be introduced by vapor draw. In some embodiments, the alcohol may be introduced by a direct liquid dispense.

Without being bound by theory, exposing the molybdenum oxide film to an alcohol at an elevated temperature is believed to provide a gentler reduction process wherein damage to surrounding substrate materials can be minimized as compared to harsher reduction reactants such as hydrogen plasma.

The processing conditions during the reduction of the molybdenum oxide film may be controlled. In some embodiments, the pressure of the processing chamber is maintained in a range of about 1 torr to about 760 torr, or about 5 torr to about 350 torr, or about 10 torr to about 100 torr.

The substrate surface may be maintained at a predetermined temperature during various process steps. In some embodiments, during the formation of the molybdenum oxide film at 110, the substrate is maintained at a temperature in a range of about 100° C. to about 500° C. or about 100° C. to about 400° C. In some embodiments, during reduction of the molybdenum oxide film at 120, the substrate is maintained at a temperature in a range of about 250° C. to about 500° C., about 250° C. to about 450° C. or about 300° C. to about 400° C.

The molybdenum films produced by some embodiments of the disclosure are highly pure. In some embodiments, the molybdenum film comprises low levels of halogens, nitrogen, carbon and oxygen. In some embodiments, the molybdenum film has an impurity content of less than or equal to about 10%, less than or equal to about 5%, less than or equal to about 2%, or less than or equal to about 1%. As used in this regard, "impurity content" is the total atomic count of atoms other than molybdenum and hydrogen within the molybdenum film.

In some embodiments, the molybdenum film comprises less than or equal to about 5 atomic % carbon, or less than or equal to about 2 atomic % carbon, or less than or equal to about 1 atomic % carbon.

In some embodiments, the molybdenum film comprises less than or equal to about 5 atomic % oxygen, or less than or equal to about 2 atomic % oxygen, or less than or equal to about 1 atomic % oxygen.

In some embodiments, the metal layer comprises greater than or equal to about 75 atomic % molybdenum, or greater than or equal to about 80 atomic % molybdenum, or greater than or equal to about 85 atomic % molybdenum, or greater than or equal to about 90 atomic % molybdenum, or greater than or equal to about 95 atomic % molybdenum.

In some embodiments, the molybdenum film has a bulk resistivity similar to bulk molybdenum deposited by a PVD process. The molybdenum deposited by a PVD process is understood to be highly pure with low resistivity. As used in this regard, a "similar" resistivity is within +/−5%, +/−2%, or +/−1% of the PVD material resistance.

In some embodiments, the molybdenum film has a resistivity of less than or equal to about 2000 μohm-cm, or less than or equal to about 1800 μohm-cm, or less than or equal to about 1700 μohm-cm, or less than or equal to about 1600 μohm-cm, or less than or equal to about 1500 μohm-cm, or less than or equal to about 1000 μohm-cm, or less than or equal to about 800 μohm-cm, or less than or equal to about 500 μohm-cm, or less than or equal to about 200 μohm-cm, or less than or equal to about 100 μohm-cm, or less than or equal to about 50 μohm-cm. In some embodiments, the molybdenum film has a resistivity of less than or equal to about 20000 ohm$^2$, or less than or equal to about 10000 ohm$^2$, or less than or equal to about 5000 ohm$^2$, or less than or equal to about 2000 ohm$^2$, less than or equal to about 1000 ohm$^2$, less than or equal to about 500 ohm$^2$, less than or equal to about 100 ohm$^2$, or less than or equal to about 50 ohm$^2$.

While a general embodiment has been described above with respect to FIG. 1, the following disclosure describes the simultaneous exposure and sequential exposure of the organometallic molybdenum precursor and the oxidant at 110. While the process steps may differ, the reactants and many of the process parameters are similar.

Figure 2:
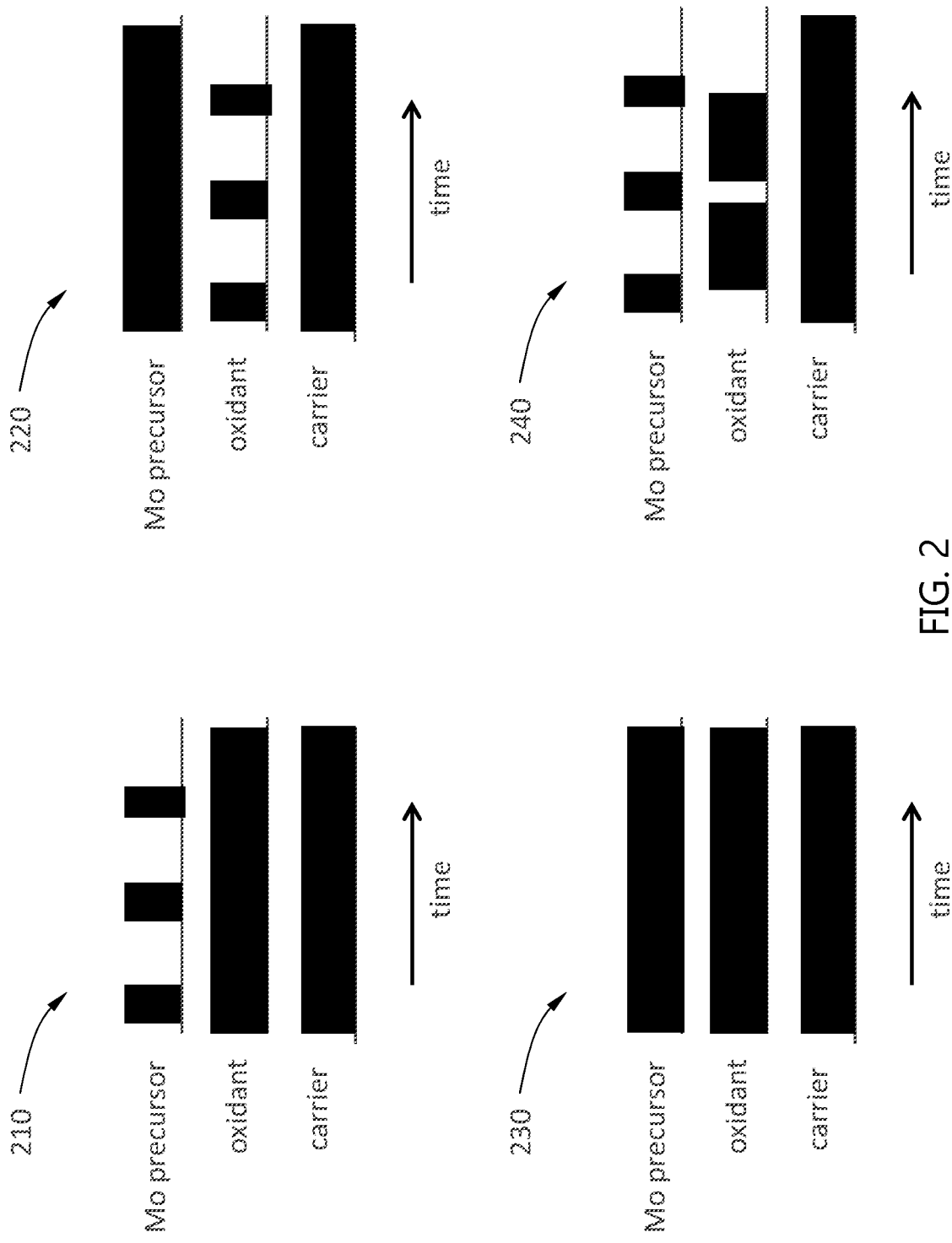
FIG. 2 illustrates an exemplary CVD process schemes for the formation of a molybdenum oxide film according to one or more embodiment of the disclosure.

Referring to FIG. 2, the disclosure relates to the deposition of molybdenum oxide films by a simultaneous or constant-flow process. In some embodiments, the simultaneous or constant-flow methods are known as CVD methods.

The CVD methods described herein expose the substrate surface to the organometallic molybdenum precursor and the oxidant at the same time. Accordingly, there is a potential within these methods for the gas phase reaction of the organometallic molybdenum precursor and the oxidant.

In some embodiments, the organometallic molybdenum precursor and/or the oxidant may be flowed constantly. In some embodiments, the organometallic molybdenum precursor and/or the oxidant may be pulsed.

In some embodiments, the organometallic molybdenum precursor and/or the oxidant may be provided with a carrier or diluent gas. As used herein, a carrier or diluent gas may be any non-reactive gas. In some embodiments, the carrier gas comprises argon.

FIG. 2 depicts a several process schemes 210, 220, 230, 240 for forming a molybdenum oxide film by a CVD process in accordance with one or more embodiment of the disclosure. Scheme 210 provides for a pulsed flow of organometallic molybdenum precursor and a constant flow of oxidant. Scheme 220 provides for a constant flow of organometallic molybdenum precursor and a pulsed flow of oxidant. Scheme 230 provides for a constant flow of organometallic molybdenum precursor and a constant flow of oxidant. Scheme 240 provides for a pulsed flow of organometallic molybdenum precursor and a pulsed flow of oxidant. As differentiated from an ALD process described below, within scheme 240, the pulses of organometallic molybdenum precursor and oxidant overlap during portions of the process scheme. The flow rate, pressure and exposure time of the organometallic molybdenum precursor and the oxidant can be any suitable values.

The CVD methods continue until a predetermined thickness has been achieved. If the predetermined thickness has not been achieved, the methods continue according to the process scheme until the predetermined thickness is reached. Once the predetermined thickness has been reached, the molybdenum oxide film may be reduced as described above.

"Atomic layer deposition" or "cyclical deposition" as used herein refers to the sequential exposure of two or more reactive compounds to deposit a layer of material on a substrate surface. As used in this specification and the appended claims, the terms "reactive compound", "reactive gas", "reactive species", "precursor", "process gas" and the like are used interchangeably to mean a substance with a species capable of reacting with the substrate surface or material on the substrate surface in a surface reaction (e.g., chemisorption, oxidation, reduction). The substrate surface, or portion thereof, is exposed separately to the two or more reactive compounds which are introduced into a reaction zone of a processing chamber.

In a time-domain ALD process, exposure to each reactive compound is separated by a time delay to allow each compound to adhere and/or react on the substrate surface and then be purged from the processing chamber. These reactive compounds are said to be exposed to the substrate sequentially. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A) is pulsed into the reaction zone followed by a first time delay. Next, a second precursor or compound B is pulsed into the reaction zone followed by a second delay. During each time delay, a purge gas, such as argon, is introduced into the processing chamber to purge the reaction zone or otherwise remove any residual reactive compound or reaction by-products from the reaction zone Referring to FIG. 3, in some embodiments, as shown in 310, the purge gas may flow continuously throughout the deposition process so that only the purge gas flows during the time delay between pulses of reactive compounds. The reactive compounds are alternatively pulsed until a desired film or film thickness is formed on the substrate surface. In some embodiments, as shown in 320, the purge gas may only be flowed between pulses of reactive compounds. In either scenario, the ALD process of pulsing compound A, purge gas, compound B and purge gas is a cycle. A cycle can start with either compound A or compound B and continue the respective order of the cycle until achieving a film with the predetermined thickness.

In an embodiment of a spatial ALD process, a first reactive gas and second reactive gas (e.g., metal precursor gas) are delivered simultaneously to the reaction zone but are separated by an inert gas curtain and/or a vacuum curtain. The substrate is moved relative to the gas delivery apparatus so that any given point on the substrate surface is exposed to the first reactive gas, the gas curtain and the second reactive gas.

The cycle of the ALD methods continue until a predetermined thickness has been achieved. If the predetermined thickness has not been achieved, the methods continue to repeat the deposition cycle until the predetermined thickness is reached. Once the predetermined thickness has been reached, the molybdenum oxide film may be reduced as described above.

Figure 3:
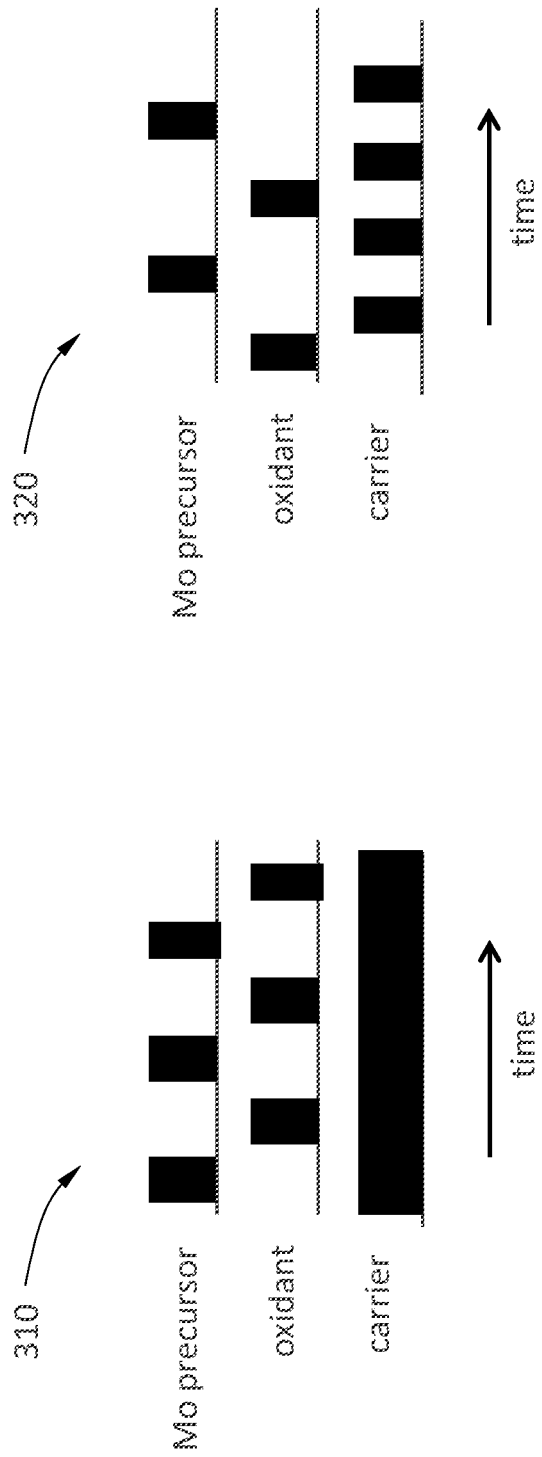
FIG. 3 illustrates an exemplary ALD process schemes for the formation of a molybdenum oxide film according to one or more embodiment of the disclosure.

With respect to the process schemes of FIGS. 2 and 3, a "pulse" or "dose" as used herein is intended to refer to a quantity of a source gas that is intermittently or non-continuously introduced into the process chamber. The quantity of a particular compound within each pulse may vary over time, depending on the duration of the pulse. A particular process gas may include a single compound or a mixture/combination of two or more compounds, for example, the process gases described below.

The durations for each pulse/dose are variable and may be adjusted to accommodate, for example, the volume capacity of the processing chamber as well as the capabilities of a vacuum system coupled thereto. Additionally, the dose time of a process gas may vary according to the flow rate of the process gas, the temperature of the process gas, the type of control valve, the type of process chamber employed, as well as the ability of the components of the process gas to adsorb onto the substrate surface. Dose times may also vary based upon the type of layer being formed and the geometry of the device being formed. A dose time should be long enough to provide a volume of compound sufficient to adsorb/chemisorb onto substantially the entire surface of the substrate and form a layer of a process gas component thereon.

While the above disclosure relates specifically to the formation of molybdenum films. It is noted that similar processes may also be utilized for the formation of tungsten films. In these embodiments, the organometallic molybdenum precursor is substituted with a tungsten precursor. The film formed is a tungsten oxide film, and the tungsten oxide film is reduced to form a highly pure tungsten film. Suitable tungsten precursors include, but are not limited to, cyclopentadienyl tungsten(II) tricarbonyl hydride, bis(t-butylimido) bis(dimethylamino) tungsten(VI), mesitylene tungsten tricarbonyl, tungsten hexacarbonyl, tetracarbonyl(1,5-cyclooctadiene) tungsten, bis(isopropylcyclopentadienyl) tungsten(IV) dihydride, and bis(cyclopentadienyl) tungsten (IV) dihydride.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method of forming a molybdenum film, the method comprising:
    exposing a substrate surface to an organometallic molybdenum precursor and an oxidant to form a molybdenum oxide film, the organometallic molybdenum precursor comprising one or more of $CpMo(CO)_2(NO)$ or $MeCpMo(CO)_2(NO)$; and
    reducing the molybdenum oxide film to form a molybdenum film.

2. The method of claim 1, wherein the organometallic molybdenum precursor comprises substantially no halogen atoms.

3. The method of claim 1, wherein the organometallic molybdenum precursor comprises at least one molybdenum-carbon bond.

4. The method of claim 3, wherein the molybdenum oxide film has a carbon content of less than or equal to about 5 atomic percent.

5. The method of claim 1, wherein the oxidant comprises one or more of oxygen, ozone, water or a plasma of one or more thereof.

6. The method of claim 1, wherein the substrate surface is maintained at a temperature in a range of about 100° C. to about 500° C. during formation of the molybdenum oxide film.

7. The method of claim 1, wherein the substrate surface is exposed to the organometallic molybdenum precursor and the oxidant simultaneously.

8. The method of claim 1, wherein the substrate surface is exposed to the organometallic molybdenum precursor and the oxidant sequentially.

9. The method of claim 8, wherein exposing the substrate surface to the organometallic molybdenum precursor and the oxidant defines an ALD cycle and multiple ALD cycles are performed before the molybdenum oxide film is reduced.

10. The method of claim 1, wherein the molybdenum oxide film has a thickness in a range of about 0.5 nm to about 10 nm.

11. The method of claim 1, wherein the substrate surface is maintained at a temperature in a range of about 250° C. to about 500° C. during formation of the molybdenum film.

12. The method of claim 1, wherein reducing the molybdenum oxide film comprises exposing the molybdenum oxide film to a reductant comprising an alcohol or hydrogen gas.

13. The method of claim 12, wherein the alcohol comprises one or more of methanol, ethanol, propanol, isopropanol or t-butanol.

14. The method of claim 12, wherein the reductant comprises a plasma formed from hydrogen gas.

15. The method of claim 1, wherein the molybdenum film has an impurity content of less than or equal to about 5 atomic percent.

16. The method of claim 1, wherein the molybdenum film has a bulk resistivity similar to a molybdenum film deposited by physical vapor deposition.

17. A method of forming a molybdenum film, the method comprising:
    exposing a substrate surface maintained at a temperature in a range of about 100° C. to about 500° C. to a plurality of ALD cycles to form a molybdenum oxide film with a thickness in a range of 0.5 nm to about 10 nm, each cycle comprising exposure to an organometallic molybdenum precursor and an oxidant, the organometallic molybdenum precursor comprising one or more of $CpMo(CO)_2(NO)$ or $MeCpMo(CO)_2(NO)$; and
    exposing the molybdenum oxide film maintained at a temperature in a range of about 250° C. to about 500° C. to an alcohol to form a molybdenum film.

18. The method of claim 17, wherein the molybdenum film has an impurity content of less than or equal to about 5 atomic percent.

19. A method of forming a molybdenum film, the method comprising:
    exposing a substrate surface to a plurality of ALD cycles to form a molybdenum oxide film with a thickness in a range of 0.2 nm to about 100 nm, each cycle comprising exposure to an organometallic molybdenum precursor and an oxidant, the organometallic molybdenum precursor comprising one or more of $CpMo(CO)_2(NO)$ or $MeCpMo(CO)_2(NO)$, the molybdenum oxide film having a carbon content of less than or equal to about 5 atomic percent; and
    exposing the molybdenum oxide film to a reductant to form a molybdenum film, the molybdenum film having an impurity content of less than or equal to about 5 atomic percent.

* * * * *